United States Patent [19]

Voss

[11] Patent Number: 4,646,270

[45] Date of Patent: Feb. 24, 1987

[54] VIDEO GRAPHIC DYNAMIC RAM

[75] Inventor: Donald J. Voss, Phoenix, Ariz.

[73] Assignee: Motorola, Inc., Schaumburg, Ill.

[21] Appl. No.: 532,330

[22] Filed: Sep. 15, 1983

[51] Int. Cl.⁴ ............................................. G11C 13/00
[52] U.S. Cl. .................................... 365/230; 365/236; 365/221
[58] Field of Search ............... 365/230, 236, 239, 221, 365/78, 240, 238, 189; 364/200 MS File, 900 MS File

[56] References Cited

U.S. PATENT DOCUMENTS

| | | | |
|---|---|---|---|
| 3,772,658 | 11/1973 | Sarlo | 365/238 |
| 3,898,632 | 8/1975 | Spencer, Jr. | 365/182 |
| 3,930,239 | 12/1975 | Salters et al. | 365/240 |
| 4,044,339 | 8/1977 | Berg | 365/240 |
| 4,099,259 | 7/1978 | Parsons et al. | 364/900 |
| 4,106,109 | 8/1978 | Fassbender | 365/238 |
| 4,330,852 | 5/1982 | Redwine et al. | 365/221 |
| 4,412,313 | 10/1983 | Ackland et al. | 365/221 |
| 4,541,076 | 9/1985 | Bowers et al. | 365/189 |

Primary Examiner—Terrell W. Fears
Attorney, Agent, or Firm—Joe E. Barbee

[57] ABSTRACT

A memory chip containing a standard dynamic RAM having the capability to serially read out data at a high rate of speed while performing standard RAM operations is provided. A standard memory latches a complete row of data into a latch. The data from the latch is then transferred upon command to a second latch or shift register where it is shifted out independently of the operation of the RAM.

14 Claims, 3 Drawing Figures

4,646,270

VIDEO GRAPHIC DYNAMIC RAM

BACKGROUND OF THE INVENTION

This invention relates, in general, to semiconductor memories, and more particularly, to a memory useful in a video graphic system.

Video graphic systems require a great deal of memory capacity. One of the most critical memory requirements for a video graphic system is the rate at which data must be read from the memory to refresh the cathode ray tube (CRT) display. Data rates of eight to fifty M bytes/sec are common. Next is the ability of the memory to have additional bandwidth to allow update of the memory without interfering with the video refresh of the CRT. The third priority is the ability to asynchronously change the data flow to another address sequence within a reasonable time. This third requirement is needed to handle smooth scrolling and multiple windows to the memory. With present memory architecture of a dynamic RAM, the data path depth must be increased to handle increased bandwidth. This increases the memory chip count and decreases the optimal size depending upon the number of display frames required. For higher density displays which require higher bandwidth, larger memory sizes are not the most efficient approach to take. In addition, it is also desirable to write into the memory at the same time that the memory is being used to refresh the CRT display.

One suggested memory had a shift register which received an entire row of data. However, since a picture frame will likely start on other than a boundary established by the first bit to be shifted out, such a memory is not considered totally satisfactory. Also this type of memory does not allow for the boundary to be changed while sequencing data for a horizontal line.

Therefore, there is a need for an architecture of a memory chip which can perform a CRT display refresh cycle by placing multiple bytes into a shift register which can then be shifted out independent of the standard access.

Accordingly, it is an object of the present invention to provide an improved memory chip.

Another object of the present invention is to provide a memory which has the capability to shift data out independently from the normal access to a standard memory.

Yet another object of the present invention is to provide a memory which can serially shift data out at a high rate of speed while providing access to odd boundaries of a CRT display associated with the memory.

SUMMARY OF THE INVENTION

The above and other objects and advantages of the present invention are achieved by providing a latch on the same integrated circuit as a standard memory array. In addition to the latch there is also provided a temporary storage register, a multiplexer, and means for controlling the multiplexer. The latch is coupled to the standard memory and receives an entire row of data. Upon command the data is transferred from the latch to the storage register. The storage register is coupled to the multiplexer which can sequentially shift out of the storage register the data stored therein.

The subject matter which is regarded as the instant invention is set forth in the appended claims. The invention itself, however, together with further objects and advantages thereof may be better understood by referring to the following detailed desciption taken in conjunction with the accompanying drawings.

The exemplifications set out herein illustrate the preferred embodiments of the invention in one form thereof and such exemplifications are not to be construed as limiting in any manner.

DETAILED DESCRIPTION OF THE DRAWINGS

Figure 1:
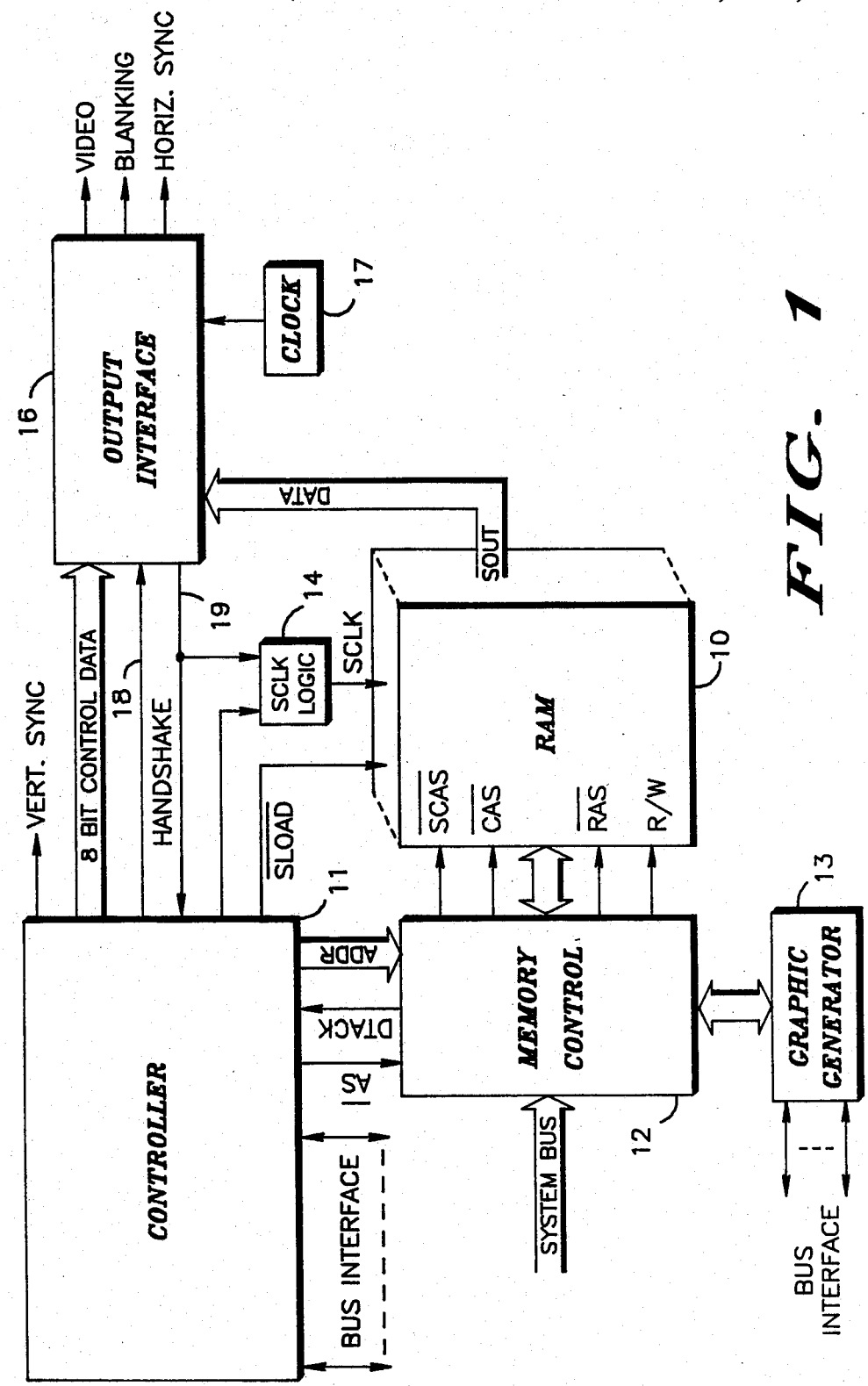
FIG. 1 is a block diagram showing a portion of the circuitry needed for controlling a CRT display.

FIG. 1 illustrates in block diagram form most of the circuitry needed in a video graphic display system. The block diagram represents, in general, just one of many video graphic display systems in which the present invention would be useful. Random access memory (RAM) 10 is used as the video display memory and the block diagram representing RAM 10 is shown as having some depth to indicate that there is more than one RAM chip being used. By use of the present invention, however, the CRT that would be connected to the video, blanking, and horizontal sync output lines of output interface 16 can be controlled with as few as four 64K dynamic RAMs. Serial data can be shifted out (SOUT) of RAM 10 at a rate in the 20 to 25 megahertz range. This data is coupled by a data bus to output interface 16. RAM 10 is controlled by an advanced CRT controller 11 which also performs other control functions for the display system. Advanced CRT controller 11 has a bus interface port which is used for connecting controller 11 to a microprocessor (not shown). Controller 11 also has an address bus plus control signals going to a memory control circuit 12. The MPU (not shown) is connected to memory control circuit 12 by a system bus. Memory control circuit 12 is also connected to memory 10 and provides required control signals for memory 10. A graphic generator 13 is connected to memory control circuit 12 as well as to the MPU by way of bus interface connections. Controller 11 provides control data to output interface 16 and is coupled to output interface 16 by two handshake lines 18 and 19. A vertical sync is provided by controller 11 for the CRT display (not shown). A serial clock logic circuit 14 receives an input from controller 11 as well as from handshake line 19. Handshake line 19 carries a signal from output interface 16 to logic circuit 14. Logic circuit 14 generates a serial clock signal which is used by RAM 10. An additional clock 17 provides the necessary timing signals for output interface 16.

Figure 2:
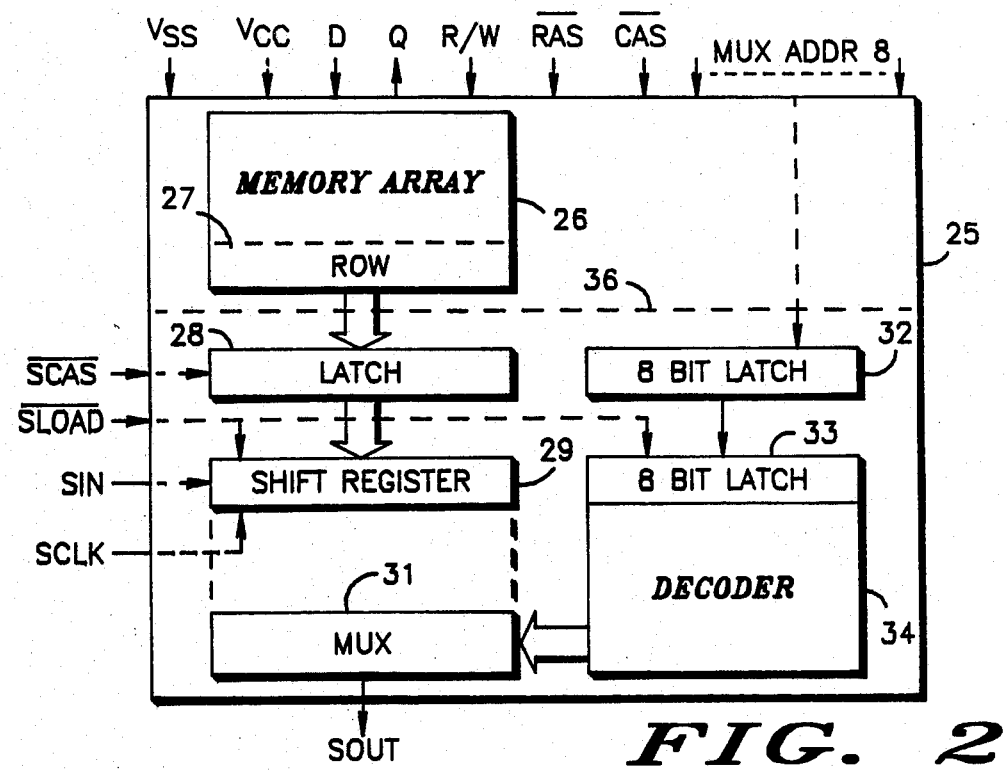
FIG. 2 shows in block diagram form an embodiment of the present invention useful in the system of FIG. 1.

FIG. 2 illustrates in block diagram form a memory chip suitable for use in memory bank 10 of FIG. 1. A memory chip 25 contains a standard memory array 26. Dotted line 27 is used to illustrate a row of data in memory array 26. The entire row of data can be transferred to a latch 28 all at once. Signal $\overline{SCAS}$ is a command used to transfer the data from row 27 to latch 28. $\overline{SCAS}$ is a serial column address strobe signal similar to $\overline{CAS}$ which is a standard well known column address strobe used in memory array 26. Memory array 26 has all of the standard interface pins necessary for a standard dynamic RAM. These pins appear as interface pins for memory chip 25. VSS and VCC provide power for memory chip 25. Pin D is a data input pin for memory array 26 while pin Q carries the data outputted by memory array 26. An R/W pin provides the read/write signal for memory array 26. Row address strobe $\overline{RAS}$, and column address strobe, $\overline{CAS}$, are supplied to memory array 26. In addition, an eight-bit multiplexer address bus is provided to eight-bit latch 32. Eight-bit latch 32 is loaded at the same time that latch 28 is loaded by $\overline{SCAS}$.

Latch 28 is coupled to a shift register 29. All of the data from latch 28 is transferred to shift register 29 upon the serial load command $\overline{SLOAD}$ signal. $\overline{SLOAD}$ signal also allows the multiplexer address from latch 32 to be transferred to an eight-bit latch 33. The data in shift register 29 is shifted to serial output line, SOUT, through a multiplexer 31 under command of a decoder 34. Decoder 34 receives the multiplexer address from eight-bit latch 33 and decodes the address to provide the command to multiplexer 31. The data from shift register 29 is shifted out serially through multiplexer 31 and timed to serial clock, SCLK, signal. An optional line connected to shift register 29 is a serial input, SIN, line which allows serial data to be coupled into shift register 29 from a source external from memory chip 25.

By way of example, if memory array 26 is a 64K×1 bit memory array such as MCM6664, which is made and sold by Motorola Inc., a 256 bit row of data can be transferred to a 256-bit latch 28. In such a case shift register 29 would be a 256-bit shift register and multiplexer 31 would be a 256 to one multiplexer, and decoder 34 would be an 8-to-256 decoder. The bandwidth of shift register 29 and how it gets loaded determines the boundary of the video display. It is very likely that a picture frame will start on other than this boundary and change several times while sequencing data for horizontal lines. The wider the shift register becomes the more severe the problem. Therefore, a multiplexer address is used which is decoded by decoder 34 and can commence shifting data out from shift register 29 at any bit location of the shift register. The serial clock signal, SCLK, will then continue shifting the data out serially through multiplexer 31. The data can be shifted out at a maximum rate of 40 nanoseconds per bit for a typical 150 nanosecond RAM. This memory architecture allows the CRT control circuitry to start on any bit within the 256-bit boundary. An additional advantage is the separation of the normal RAM cycle timing from the loading of shift register 29 which comes about with the inclusion of buffer latch 28 and separate load input signal $\overline{SLOAD}$. To keep the serial data stream going the loading of shift register 29 must be precise to twice the shift clock. With this separation the RAM cycle is independent of the loading time. Memory array 26 performs standard memory operations, such as reading and writing, through pins D and Q when there is a $\overline{RAS}$, $\overline{CAS}$ cycle.

Dotted line 36 is used to illustrate, in memory chip 25, the standard memory array above line 36 and the newly-added circuit below dotted line 36.

In operation, the serial fetch of data from output SOUT is independent of the operation of memory array 26 once buffer latch 28 is loaded. After the data from latch 28 is transferred from shift register 29, memory array 26 is free to reload latch 28 at any time after the transfer but before all the data has been shifted out of shift register 29 through multiplexer 31. $\overline{RAS}$ signal is used to enable the data such as in row 27. $\overline{SCAS}$ is used to obtain output positions of the serial data in shift register 29 through control of multiplexer 31. The negative transition of $\overline{SCAS}$ latches the 8-bit multiplexer address into latch 32. The positive transition of $\overline{SCAS}$ latches the data in buffer latch 28. At this time memory array 26 is released to complete the precharge and additional cycles. When the CRT controller has shifted out old data it can load data to shift register 29 on its own timing, at which time, the 8-bit address is also transferred to decoder 34. Decoder 34 and multiplexer 31 allow the output data position within shift register 29 to be selected. Data is then shifted out at the clock rate of SCLK from the chosen position followed by those bits of higher address within shift register 29. $\overline{SLOAD}$ is a signal provided by the CRT controller and is triggered when shift register 29 is empty.

Figure 3:
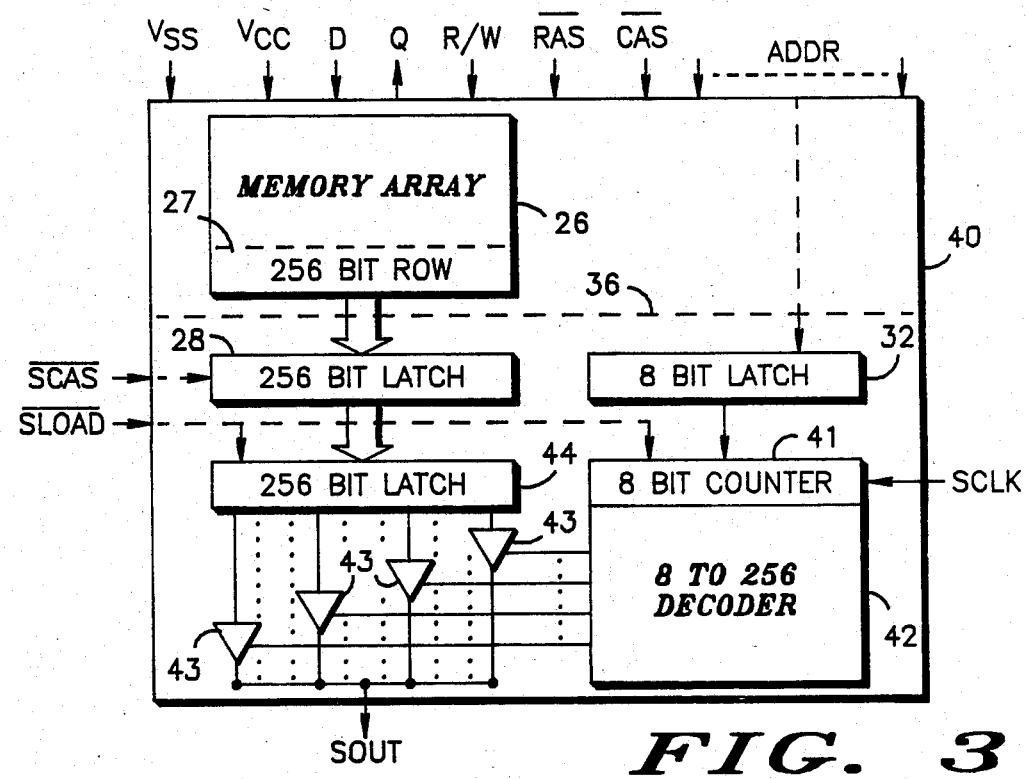
FIG. 3 shows yet another embodiment of the present invention useful in the system of FIG. 1.

FIG. 3 illustrates another embodiment of memory chip 25 of FIG. 2. In FIG. 3, memory chip 40 contains many similar elements to the elements of FIG. 2. Such similar elements are identified by the same reference numerals and their function and operation will not be reiterated in detail. The main difference with memory chip 40 is in the manner that the serial data is selected for shifting out. A second latch 44 is coupled to latch 28 and is loaded upon command of $\overline{SLOAD}$. Latch 44 is coupled to output SOUT by a plurality of controllable buffers 43. Although only a few of controllable buffers 43 are illustrated it will be recognized that each bit stored in latch 44 requires one buffer or controllable gate to couple it to the SOUT pin. The controllable buffers 43 are controlled by outputs from decoder 42. The address that is decoded by decoder 42 is received by latch 32 and coupled to counter 41 upon the $\overline{SLOAD}$ signal. Counter 41 provides the address to be decoded to decoder 42 and at the same time receives SCLK signal which sequentially varies the output of decoder 42 so that data from latch 44 can be coupled sequentially by the proper buffer 43 to the SOUT pin. Memory chip 40 is illustrated, only by way of example, as having a 64K×1 bit memory array, thereby providing a 256-bit row. Accordingly then latch 28 and latch 44 are each 256 bits wide. And since 256 bits can be coded into an 8-bit signal latch 32 and counter 41 are each eight bits wide. It then follows that decoder 42 is an 8-to-256 decoder. Decoder 42 and the plurality of controllable buffers 43 function as a multiplexer to couple the data from latch 44 to the single output pin SOUT.

It will be noted that the present invention is applicable to larger as well as smaller memories than 64K. The latch should be large enough to hold the number of bits in a row, i.e. $2^n$ bits where n is an integer. Then the number of bits handled by the decoder section should be equal to n.

Although the memory array of the present invention has been illustrated in conjunction with a CRT video system it should be recognized that such a memory chip can be used effectively in a data buffer for DMA applications wherein data is placed in a RAM through a standard mode of operation and then DMAed out using the serial mode such as a huge type of FIFO system. Another use would be prefetching of instructions from a program RAM to rapidly fill a CACHE system. Yet another application would be in disk transfers at independent speeds.

By now it should be appreciated that there has been provided an improved memory chip which is extremely useful in shifting out data at a high rate of speed while allowing the main memory array of the memory chip to function in a normal manner. When this improved memory chip is used in a video circuit it allows the CRT display to be refreshed while updating the RAM with new information. Other advantages are that the RAM bandwidth is increased and a boundary condition within the memory can be overcome. The chip is useful in video digitizing and serial data retrievals.

I claim:

1. A monolithic memory capable of providing output data at a high speed, comprising: a memory array; a latch capable of latching a plurality of data bits, the latch being coupled to the memory array for temporarily storing data from the memory array; a shift register capable of storing a plurality of data bits, the shift register being coupled to the latch for receiving the data temporarily stored in the latch; and a multiplexer coupled to the shift register for selecting a predetermined data bit fron the shift register and for sequentially coupling the data out of the shift register to an output pin of the memory commencing with the predetermined data bit while data is simultaneously written/read into or out of the memory array.

2. The memory of claim 1 further including means for commanding the multiplexer to select the predetermined data bit.

3. The memory of claim 2 wherein the means for commanding is a decoder.

4. The memory of claim 1 wherein the latch and the shift register each handle the same number of data bits so that plurality in each case is equal to an integer n, and wheredn the multiplexer is an n-to-one multiplexer.

5. The memory of claim 4 wherein n equals 256.

6. The memory of claim 1 wherein the memory array is a dynamic random access memory (RAM).

7. A method of reading data out of a memory system at a high rate of speed, comprising: latching a block of data from a memory array into a first temporary stroage, wherein the block of data contains a predetermined number of bits; loading the block of data from the first temporary storage into a second temporary storage; selecting a particular bit in the block of data in the second temporary storage to shift out first and then continuing shifting out data fron the second temporary storage in a sequential manner; and reading/writing data into or out of the memory in a normal manner while the data is being shifted out of the second temporary storage.

8. The method of claim 7 further including latching another block of data in the first temporary storage during the time that the data is being shifted out of the second temporary storage.

9. A video display system having at least a memory system, and a controller to control operation of the video display system, the memory system comprising: a memory array; a latch coupled to the memory array for storing at least one row of data from the memory array, the latch being loaded upon a first command from the controller; first means coupled to the latch for receiving the row of data from the latch upon a second command from the controller; and second means for selecting a predetermined bit in the first means to commence serially shifting data out of the first means while access to the memory array can be simultaneously accomplished.

10. A video display system having at least a memory system, and a controller to control operation of the video display system, the memory system comprising: a memory array; a latch coupled to the memory array for storing at least one row of data from the memory array, the latch being loaded upon a first command from the controller; first means coupled to the latch for receiving the row of data from the latch upon a second command from the controller; and second means for selecting a predetermined bit in the first means to commence serially shifting data out of the first means wherein the second means includes an address latch for temporarily storing an address of the predetermined bit, a decoder for decoding the temporarily stored address, and a plurality of controllable means controlled by the decoder for serially coupling the data out of the first means.

11. A architecture for a high speed memory placed on an integrated circuit chip, the integrated circuit having a strandard dynamic random access memory (RAM) and further comprising: first means for temporarily storing a block of data from the RAM; second means coupled to the first means for controllably receiving the block of data from the first means; a temporary storage for temporarily storing an address for a predetermined bit of data within the block of data; a decoder coupled to the temporary storage for decoding the address of the predetermined bit; and third means coupled to the second means and to the decoder for outputting the data of the second means upon command while allowing the RAM to be written into and read from in a normal manner during the time the data is being outputted from the second means and wherein the decoder provides the address of the predetermined bit to the second means.

12. The architecture for a high speed memory of claim 11 further including a counter located between the temporary storage and the decoder to coupled the address to be decoded from the temporary storage to the decoder and then to sequentially vary subsequent addresses which are decoded.

13. The architecture for a high speed memory of claim 11 wherein the first and second means are latches and the third means are a plurality of controllable gates which are individually controlled by the decoder.

14. The architecture for a high speed memory of claim 11 wherein the first means is a latch, the second means is a shift register, and the third means is a multiplexer.

* * * * *

UNITED STATES PATENT AND TRADEMARK OFFICE
CERTIFICATE OF CORRECTION

PATENT NO. : 4,646,270
DATED : February 24, 1987
INVENTOR(S) : Donald J. Voss

It is certified that error appears in the above-identified patent and that said Letters Patent is hereby corrected as shown below:

Claim 1, line 10, change "fron" to -- from --.

Claim 4, line 4, replace "wheredn" by -- wherein --.

Claim 7, line 9, change "fron" to -- from --.

Claim 11, line 1, replace "A" by -- An --.

Claim 11, line 3, replace "strandard" by -- standard --.

Claim 12, line 3, replace "coupled" by -- couple --.

Signed and Sealed this

Twenty-second Day of December, 1987

Attest:

DONALD J. QUIGG

Attesting Officer     Commissioner of Patents and Trademarks